(12) United States Patent
Hopper et al.

(10) Patent No.: US 6,972,995 B1
(45) Date of Patent: Dec. 6, 2005

(54) IMAGING CELL WITH A NON-VOLATILE MEMORY THAT PROVIDES A LONG INTEGRATION PERIOD AND METHOD OF OPERATING THE IMAGING CELL

(75) Inventors: Peter J. Hopper, San Jose, CA (US); Philipp Lindorfer, San Jose, CA (US); Vladislav Vashchenko, Palo Alto, CA (US); Wendy Greig, Davenport, CA (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/821,391

(22) Filed: Apr. 9, 2004

(51) Int. Cl.$^7$ ............................................. G11C 16/04
(52) U.S. Cl. ........................... 365/185.19; 365/185.26; 365/185.01
(58) Field of Search ................ 365/185.19, 185.26, 365/185.01, 185.03

(56) References Cited

U.S. PATENT DOCUMENTS

| | | | |
|---|---|---|---|
| 5,710,446 A | 1/1998 | Chi et al. | 257/225 |
| 5,808,937 A | 9/1998 | Chi et al. | 365/185.33 |
| 5,932,873 A | 8/1999 | Bergemont et al. | 250/208.1 |
| 5,953,061 A * | 9/1999 | Biegelsen et al. | 348/308 |
| 5,962,844 A | 10/1999 | Merrill et al. | 250/214 A |
| 5,965,875 A | 10/1999 | Merrill | 250/226 |
| 5,982,012 A | 11/1999 | Merrill | 257/463 |
| 6,002,432 A | 12/1999 | Merrill et al. | 348/241 |
| 6,018,365 A | 1/2000 | Merrill | 348/302 |
| 6,088,058 A | 7/2000 | Mead et al. | 348/296 |
| 6,160,282 A | 12/2000 | Merill | 257/292 |
| 6,211,510 B1 * | 4/2001 | Merrill et al. | 250/208.1 |
| 6,246,043 B1 | 6/2001 | Merrill | 250/208.1 |
| 6,369,853 B1 | 4/2002 | Merrill et al. | 348/302 |
| 6,410,899 B1 | 6/2002 | Merrill et al. | 250/208.1 |
| 6,452,633 B1 | 9/2002 | Merrill et al. | 348/302 |
| 6,476,372 B2 | 11/2002 | Merrill et al. | 250/208.1 |
| 6,512,544 B1 | 1/2003 | Merrill et al. | 348/302 |
| 6,525,304 B1 | 2/2003 | Merrill et al. | 250/208.1 |
| 6,606,120 B1 | 8/2003 | Merrill et al. | 348/273 |
| 6,632,701 B2 | 10/2003 | Merrill | 438/70 |
| 6,636,261 B1 | 10/2003 | Pritchard et al. | 348/308 |
| 6,697,114 B1 | 2/2004 | Merrill | 348/308 |
| RE38,499 E | 4/2004 | Merrill et al. | 348/301 |
| 6,727,521 B2 | 4/2004 | Merrill | 257/98 |
| 6,731,397 B1 | 5/2004 | Merrill et al. | 358/1.16 |
| 6,741,283 B1 | 5/2004 | Merrill et al. | 348/308 |
| 6,760,070 B1 | 7/2004 | Merrill et al. | 348/294 |
| 2003/0151686 A1 * | 8/2003 | Koyama | 348/304 |
| 2004/0042296 A1 * | 3/2004 | Tempel | 365/202 |
| 2004/0047202 A1 * | 3/2004 | Tanzawa et al. | 365/201 |
| 2004/0056176 A1 * | 3/2004 | Shizukuishi | 250/208.1 |
| 2004/0217398 A1 * | 11/2004 | Lee | 257/292 |

OTHER PUBLICATIONS

U.S. Appl. No. 10/664,469, filed Sep. 17, 2003, Mirgorodski et al.
U.S. Appl. No. 10/664,758, filed Sep. 17, 2003, Mirgorodski et al.
U.S. Appl. No. 10/665,185, filed Sep. 17, 2003, Mirgorodski et al.

* cited by examiner

*Primary Examiner*—Richard Elms
*Assistant Examiner*—Dang T. Nguyen
(74) *Attorney, Agent, or Firm*—Peyton C. Watkins

(57) ABSTRACT

The image capture period of an imaging cell, or the total time that an imaging cell is exposed to light energy, is substantially increased by utilizing a non-volatile memory (NVM), such as an electrically-erasable, programmable, read-only-memory (EEPROM) structure. The NVM structure stores and integrates charges that are proportional to the absorbed photons over a large number of sequential integration periods.

13 Claims, 1 Drawing Sheet

IMAGING CELL WITH A NON-VOLATILE MEMORY THAT PROVIDES A LONG INTEGRATION PERIOD AND METHOD OF OPERATING THE IMAGING CELL

BACKGROUND OF THE INVENTION

1. Field of the Invention

The present invention relates to imaging cells and, more particularly, to an imaging cell with a non-volatile memory that provides a long integration period and a method of operating the imaging cell.

2. Description of the Related Art

Traditional film-based cameras are rapidly being replaced by digital cameras that utilize a large number of imaging cells to convert the light energy received from an image into electric signals that represent the image. One type of imaging cell that is used in digital cameras to capture the light energy from an image is an active pixel sensor cell.

FIG. 1 shows a schematic diagram that illustrates a prior-art active pixel sensor cell 100. As shown in FIG. 1, cell 100 includes an n+/p− photodiode 112, and an n-channel reset transistor 114 that has a drain connected to a supply voltage VCC, a gate connected to receive a reset pulse, and a source connected to the n+ region of photodiode 112.

In addition, active pixel sensor cell 100 also includes an n-channel sense transistor 116 that has a source, a drain connected to the supply voltage VCC, and a gate connected to the n+ region of photodiode 112 and the source of reset transistor 114. Cell 100 further includes an n-channel row select transistor 118 that has a source, a drain connected to the source of sense transistor 116, and a gate connected to receive a select signal.

The operation of active pixel sensor cell 100 can be performed in four steps: a reset step, where cell 100 is reset from the previous integration cycle; a pre-integration read step, where cell 100 is read to establish an initial condition, an image integration step, where the light energy is collected and converted into an electrical signal; and a post integration read step, where cell 100 is read to establish a final condition.

As shown in FIG. 1, during the reset step, the gate of reset transistor 114 is briefly pulsed with a reset voltage which resets photodiode 112 to an initial integration voltage equal to VCC-VT, where VCC represents the supply voltage VCC, and VT represents the threshold voltage of reset transistor 114. Thus, at the beginning of the integration period, the n+ region of photodiode 112 has a voltage of VCC-VT.

Prior to beginning the image integration period, active pixel sensor cell 100 is read by turning on row select transistor 118. When row select transistor 118 is turned on, the voltage on the n+ region of photodiode 112 sets the voltage on the gate of sense transistor 116 which, in turn, sets the magnitude of the current flowing through transistors 116 and 118. The initial current level is then detected by conventional current detectors.

Once the pre-integration current level has been determined, image integration begins. During integration, light energy, in the form of photons, strikes photodiode 112, thereby creating a number of electron-hole pairs. Photodiode 112 is designed to limit recombination between the newly formed electron-hole pairs. As a result, the photogenerated holes are attracted to ground via the p− region of photodiode 112, while the photogenerated electrons are attracted to the n+ region of photodiode 112 where each additional electron reduces the voltage on the n+ region of photodiode 112.

Following the image integration period, active pixel sensor cell 100 is again read by turning on row select transistor 118. When row select transistor 118 is turned on, the reduced voltage on the n+ region of photodiode 112 reduces the voltage on the gate of sense transistor 116 which, in turn, reduces the magnitude of the current flowing through transistors 116 and 118. The reduced current level is then detected by conventional current detectors.

Following this, the number of photons that were absorbed by photodiode 112 during the image integration period is determined by subtracting the reduced current level read out at the end of the integration period from the initial current level read out at the beginning of the integration period.

Cell 100 need not be read at the beginning of each image integration period if the initial current level is substantially constant. In addition, the initial current level can alternately be read each time the reduced current level is read, but after the reduced current level has been read and cell 100 has been reset.

One drawback of active pixel sensor cell 100 is that cell 100 typically operates poorly under low light conditions. With conventional film-based cameras, the amount of time that the shutter is open (the f stop) can be adjusted from, for example, one thousandth of a second to capture an image of an object in motion, up to several seconds to capture an image of an object under very low light conditions, such as at night.

With an active pixel sensor cell, however, the maximum time that a cell can be exposed to light energy is in the order of milliseconds. This is because a leakage current in the photodiode, known as a dark current, can pull the initial integration voltage down to ground in approximately this period of time. The leakage current is known as a dark current because the leakage current can pull the initial integration voltage down to ground when no light energy at all is present.

Thus, when an active pixel sensor cell is exposed to the light energy from an image during an integration period, the initial integration voltage falls in response to both the received light energy as well as the dark current. When the integration period is relatively short, the dark current erroneously reduces the post integration current by only a small amount.

However, when the integration period is relatively long, such as milliseconds, the received light energy from the image is effectively lost because the dark current has sufficient time to pull the voltage on the photodiode down to ground or near ground. Thus, since an active pixel sensor cell is limited to an integration period that is in the order of milliseconds, active pixel sensor cells can not collect light energy for a long period of time and, therefore, are less than optimum when operating in low light conditions.

As a result, there is a need for an imaging cell that has a longer integration period which, in turn, allows light energy to be captured by the cell under low light conditions.

DETAILED DESCRIPTION OF THE INVENTION

Figure 2:
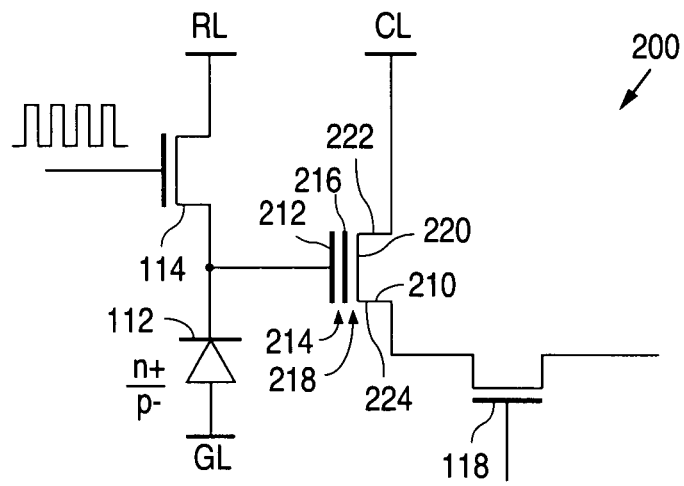
FIG. 2 is a schematic diagram illustrating an example of an imaging cell 200 in accordance with the present invention.

FIG. 2 is a schematic diagram that illustrates an example of an imaging cell 200 in accordance with the present invention. As described in greater detail below, the present invention provides a substantially increased integration period, when compared to active pixel sensor cell 100, by utilizing a non-volatile memory (NVM) structure to incrementally store a charge that represents the captured light energy.

Imaging cell 200 is similar to cell 100 and, as a result, utilizes the same reference numerals to designate the structures which are common to both cells. As shown in FIG. 2, imaging cell 200 differs from active pixel sensor cell 100 of FIG. 1 in that imaging cell 200 utilizes an n-channel electrically-erasable, programmable, read-only-memory (EEPROM) structure 210 in lieu of sense transistor 116.

EEPROM structure 210, which can be formed as either a single poly structure or a double poly structure in a conventional manner, has a conductive control gate 212 that contacts the n+ region of photodiode 112, a first layer of dielectric 214 (such as oxide-nitride-oxide (ONO)) that contacts control gate 212, a conductive floating gate 216 that contacts dielectric layer 214, and a second layer of dielectric 218 that contacts floating gate 216.

In addition, EEPROM structure 210 is formed to have a coupling ratio so that the potential on floating gate 216 is approximately 90% of the voltage on the n+ region of photodiode 112. (First dielectric layer 214 can be formed to be approximately 0.1 to 10× larger in area than second dielectric layer 218.)

EEPROM structure 210 also includes a channel region 220 of a p− material that lies below floating gate 216, an n+ drain region 222 that is formed in the p− material to contact channel region 220, and a spaced-apart, n+ source region 224 that is also formed in the p− material to contact channel region 220. In addition, source region 224 is electrically connected to the drain of select transistor 118. (EEPROM structure 210 is one example of a non-volatile memory cell. Other NVM structures, such as more complex flash memory structures, can alternately be used.)

As further shown in FIG. 2, imaging cell 200 also differs from active pixel sensor cell 100 in that cell 200 has a first line RL that is connected to the drain of reset transistor 114, a second line CL that is connected to drain region 222 of EEPROM structure 210, and a third line GL that is connected to the p− region of photodiode 112. (First line RL, second line CL, and third line GL can be connected to other imaging cells in an array of cells having rows and columns.)

In operation, imaging cell 200 begins an image capture cycle by placing a positive first read voltage, e.g., +3.3V, on first line RL, and a positive second read voltage, e.g., +3.3V, on second line CL which, in turn, places the second read voltage on drain region 222 of EEPROM structure 210. In addition, a reverse-bias voltage, e.g., ground, is placed on third line GL, while ground is placed on source region 224 of EEPROM structure 210 via select transistor 118.

Following this, imaging cell 200 pulses on reset transistor 114 which places the first read voltage (less the threshold voltage of reset transistor 114) on both the n+ region of photodiode 112 and the control gate 212 of EEPROM structure 210. The first read voltage is greater than the reverse-bias voltage which insures that n+/p− photodiode 112 remains reverse biased.

When the first read voltage is placed on control gate 212, EEPROM structure 210 sources a pre-image cycle current that has a magnitude which is a function of the total charge on floating gate 216. The magnitude of the pre-image cycle current is then sensed by conventional current detectors.

Following this, imaging cell 200 places a positive first programming voltage, e.g., +6V, on first line RL, and a positive second programming voltage, e.g., +6V, on second line CL which, in turn, places the second programming voltage on drain region 222 of EEPROM structure 210. In addition, a reverse-bias voltage, e.g., ground, is placed on third line GL, while ground is placed on source region 224 of EEPROM structure 210.

Next, imaging cell 200 pulses on reset transistor 114 which places the first programming voltage (less the threshold voltage of reset transistor 114) on both the n+ region of photodiode 112 and the control gate 212 of EEPROM structure 210. The first programming voltage is greater than the reverse-bias voltage which insures that n+/p− photodiode 112 remains reverse biased.

When the first programming voltage is placed on control gate 212, EEPROM structure 210 begins injecting electrons onto floating gate 216 via hot electron injection which, in turn, begins programming EEPROM structure 210. (Hot electron injection is a well-known process for programming non-volatile memory devices.)

At the same time, photodiode 112 begins pulling down the magnitude of the first programming voltage that was placed on both the n+ region of photodiode 112 and control gate 212. The magnitude of the first programming voltage is pulled down over a first integration period (which begins when the first programming voltage is placed on the n+region) as the light energy collected by photodiode 112 is converted into electrons that reduce the voltage on the n+ region of photodiode 112. As the voltage on the n+ region of photodiode 112 is reduced, the voltage on control gate 212 is also reduced.

As the voltage on control gate 212 is reduced, the number of electrons that are injected onto floating gate 216 is reduced. Thus, dim light or no light conditions reduce the magnitude of the first programming voltage only slightly which, in turn, means that the number of electrons that are injected (as EEPROM structure 210 is programmed) decreases only slightly, if at all, over the integration period. However, a bright light source substantially reduces the magnitude of the first programming voltage which, in turn, means that the number of electrons that are injected (as EEPROM structure 210 is programmed) substantially decreases over the integration period.

Eventually, if the magnitude of the first programming voltage on control gate 212 is reduced far enough, electron injection, and thereby the programming of EEPROM structure 210, substantially stops. As a result, the total charge held by EEPROM structure 210 at the end of the first integration period represents the light energy collected during the first integration period.

At the end of the first integration period, imaging cell 200 again pulses on reset transistor 114 which, in turn, again places the first programming voltage (less the threshold voltage of reset transistor 114) on both the n+ region of photodiode 112 and the control gate 212 of EEPROM structure 210.

When the first programming voltage is placed on both the n+region of photodiode 112 and the control gate 212 of EEPROM structure 210, EEPROM structure 210 again begins injecting electrons onto floating gate 216 via hot electron injection, thereby further programming EEPROM structure 210.

Photodiode 112 again pulls down the magnitude of the first programming voltage placed on the n+ region of photodiode 112 and control gate 212. The magnitude of the first programming voltage is pulled down over a second integration period, which begins when the first programming voltage is placed on control gate 212 for the second time, as the light energy collected by photodiode 112 is converted into electrons that reduce the voltage on the n+ region which, in turn, reduce the voltage on control gate 212. As a result, the total charge held by EEPROM structure 210 at the end of the second integration period represents the sum of the light energy collected during the first and second integration periods.

Imaging cell 200 then repeats the above steps for a third integration period, and continues until n sequential integration periods have been completed. As a result, at the end of the n sequential integration periods, the total charge held by EEPROM structure 210 represents the sum of the light energy collected during the n sequential integration periods.

Thus, a train of reset pulses on the order of nS per pulse are used to continuously reset photodiode 112 to inject electrons into floating gate 216 of EEPROM structure 210. Structure 210 then collects and integrates the charge over an image capture cycle that is substantially longer than conventional integration periods, which are on the order of milliseconds.

Once the last integration period has been completed, the total charge stored on EEPROM structure 210 is then read. To read the charge, imaging cell 200 places the first read voltage on first line RL, and the second read voltage on second line CL which, in turn, places the second read voltage on drain region 222 of EEPROM structure 210. Ground is also placed on source region 224 of EEPROM structure 210 via select transistor 118. The first and second read voltages are less than the first and second programming voltages, respectively.

Following this, imaging cell 200 pulses on reset transistor 114 which places the first read voltage (less the threshold voltage of reset transistor 114) on both the n+ region of photodiode 112 and the control gate 212 of EEPROM structure 210. When the first read voltage is placed on control gate 212, EEPROM structure 210 sources a post image cycle current. The post image cycle current, which has a lower magnitude than the pre-image cycle current, is a function of the total charge on floating gate 216. The magnitude of the post image cycle current is then sensed by conventional current detectors.

Following this, the number of photons that were absorbed over the image capture cycle by photodiode 112 is determined by subtracting the post image cycle current read at the end of the last integration period from the pre-image cycle current level read at the beginning of the first integration period.

Imaging cell 200 is erased prior to the next image capture cycle via exposure to UV light, or Fowler-Nordheim tunneling. With Fowler-Nordheim tunneling, voltages are placed on control gate 212 (via reset transistor 114), the p– material of channel 220, drain region 222, and source region 224 that is sufficient to cause electrons which are stored on floating gate 216 to tunnel through to control gate 212, the p– material of channel 220, drain region 222, or source region 224, depending on where the tunneling is to take place.

EEPROM structure 210 need not be read at the beginning of each image capture cycle if the charge on floating gate 216 of EEPROM structure 210 can be set to a substantially constant level each time structure 210 is erased. (In addition, the pre-image cycle current level can alternately be read out each time the post image cycle current is read out, but after the post image cycle current level has been read out, and a charge has again been set on floating gate 216 after EEPROM structure 210 has been erased.)

Figure 1:
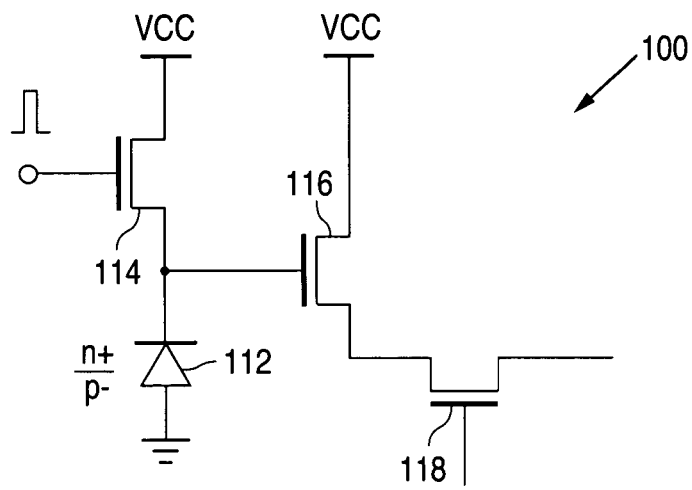
FIG. 1 is a schematic diagram illustrating a prior-art active pixel sensor cell 100.

Thus, where active pixel sensor cell 100 of FIG. 1 performs a single integration that lasts for a single integration period to capture an image, imaging cell 200 performs a large number of integrations that each last for an integration period that is much shorter than the single integration period to capture an image.

In accordance with the present invention, by utilizing a large number of integrations, where each lasts for an integration period that is substantially shorter than the single integration period, the level of dark current collected by a cell can be kept well into the linear region away from the saturation region.

An imaging cell saturates, and becomes useless, when the total light energy and the dark current pulls the voltage on the n+ region of the photodiode down to ground before the end of the integration period. By keeping the integration periods short, the level of dark current does not have the time to reach the saturation region.

Therefore, in accordance with the present invention, imaging cell 200 effectively provides a substantially longer integration period than active pixel sensor cell 100, while at the same time avoiding the effects of dark current. Thus, one of the benefits of the present invention is that since the present invention substantially increases the integration period of an imaging cell, the present invention is particularly advantageous when operating in low-light conditions, such as when taking a photograph of city streets at night, or provides a diode area shrink path, i.e., can use a smaller diode since the overall signal-to-noise (S/N) ratio (where the dark current is the primary noise source) is better. (In other words, since the S/N ratio is better, a smaller cell can be used to provide a S/N ratio that is equivalent to prior art devices.)

In addition to hot electron injection, EEPROM structure 210 can also be programmed by utilizing a gate induced drain leakage (GIDL) current. The GIDL current is a strong drain-to-gate voltage dependent current which results from a high electric field across dielectric layer 218 of EEPROM structure 210 in the region where floating gate 216 vertically overlaps a portion of the drain region of EEPROM structure 210.

For example, with GIDL-effect programming, imaging cell 200 places a negative third programming voltage, e.g., –2V, on the first line RL (which is greater than the reverse-bias voltage), and a positive fourth programming voltage, e.g., +4.6V, on second line CL which, in turn, places the fourth programming voltage on the drain of EEPROM structure 210. In addition, ground is also placed on the source of EEPROM structure 210 via select transistor 118.

Following this, imaging cell 200 pulses on reset transistor 114 which places the negative third programming voltage (less the threshold voltage of reset transistor 114) on both the n+ region of photodiode 112 and the control gate 212 of EEPROM structure 210. The negative third programming voltage is greater than the reverse biased voltage to insure that the n+/p– junction remains reverse biased. When the negative third programming voltage is placed on control gate 212 of EEPROM structure 210, no (or very little) electron injection occurs.

At the same time, photodiode 112 begins pulling down the magnitude of the third programming voltage that was placed on both the n+ region of photodiode 112 and control gate 212. The magnitude of the negative third programming voltage is pulled down over a first integration period (which begins when the negative third programming voltage is placed on the n+ region) as the light energy collected by photodiode 112 is converted into electrons that reduce the voltage on the n+ region of photodiode 112.

As the voltage on the n+ region of photodiode 112 decreases, the strength of the electric field across dielectric layer 218 increases. The strong electric field forms a deep depletion region under floating gate 216 in the floating gate/drain overlap region which, in turn, generates electrons and holes by band-to-band tunneling at the silicon—silicon dioxide interface. The resulting drain-to-body current, which injects high-energy electrons into the drain region of EEPROM structure 210, forms the GIDL current which has ionizing collisions that form hot electrons. Thus, hot electrons begin to be injected onto floating gate 216 due to the GIDL effect.

GIDL-effect programming can be performed as described in U.S. patent application Ser. No. 10/665,185 (the '185 application) for "Low Cost Current Method of Programming a PMOS Stacked-Gate Memory Cell Utilizing GIDL Effect" filed on filed Sep. 17, 2003, and which is hereby incorporated by reference. (Although the '185 application describes GIDL-effect programming in terms of a PMOS device, the description applies to NMOS devices when the conductivities are reversed. e.g., electron injection increases as the voltage on the control gate becomes negative with a positive voltage on the drain.)

Thus, as the voltage on control gate 212 falls, the number of electrons that are injected onto floating gate 216 increases. Thus, dim light or no light conditions decrease the magnitude of the third programming voltage only slightly which, in turn, means that few electrons are injected, if any, over the integration period.

However, a bright light source substantially decreases the magnitude of the negative third programming voltage which, in turn, means that the number of electrons that are injected (as EEPROM structure 210 is programmed) substantially increases over the integration period. As a result, the total charge held by EEPROM structure 210 at the end of the first integration period represents the light energy collected during the first integration period.

At the end of the first integration period, imaging cell 200 pulses on reset transistor 114 which, in turn, again places the negative third programming voltage (less the threshold voltage of reset transistor 114) on both the n+ region of photodiode 112 and the control gate 212 of EEPROM structure 210.

When the negative third programming voltage is again placed on both the n+ region of photodiode 112 and the control gate 212 of EEPROM structure 210, EEPROM structure 210 again begins injecting electrons onto floating gate 216 via the GIDL effect as the voltage on the n+ region of photodiode 112 decreases over a second integration period. As a result, the total charge held by EEPROM structure 210 at the end of the second integration period represents the sum of the light energy collected during the first and second integration periods.

Imaging cell 200 then repeats the above steps for a third integration period, and continues until n sequential integration periods have been completed. As a result, at the end of the n sequential integration periods, the total charge held by EEPROM structure 210 represents the sum of the light energy collected during the n sequential integration periods.

Thus, even if only a few electrons are injected onto floating gate 216 during a single integration period, when integrated over a large number of times, the total charge present on floating gate 216 can be substantially increased. As above, once the last integration period has been completed, the total charge stored on EEPROM structure 210 is then read to determine the post image capture current.

Figure 3:
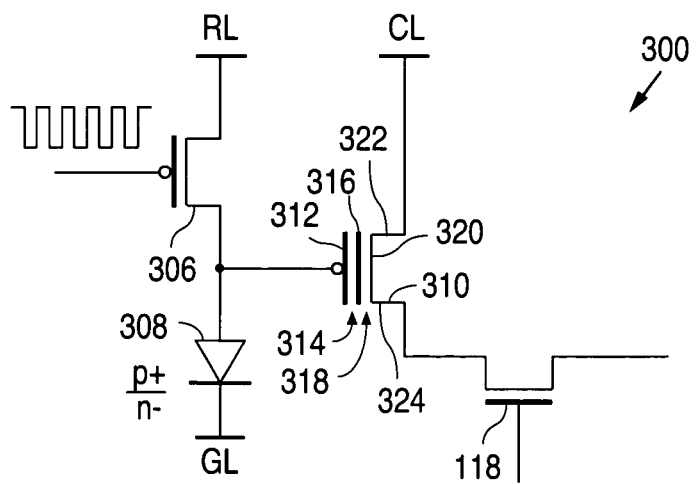
FIG. 3 is a schematic diagram illustrating an example of an imaging cell 300 in accordance with the present invention.

FIG. 3 is a schematic diagram that illustrates an example of an imaging cell 300 in accordance with the present invention. Imaging cell 300 is similar to imaging cell 200 and, as a result, utilizes the same reference numerals to designate the structures which are common to both cells.

As shown in FIG. 3, imaging cell 300 differs from cell 200 in that imaging cell 300 utilizes a p-channel reset transistor 306 in lieu of n-channel reset transistor 114. Reset transistor 306 has a drain, a source connected to the first line RL, and a gate connected to receive the train of reset pulses. As above, the reset pulses are on the order of nS per pulse.

Imaging cell 300 also differs from cell 200 in that imaging cell 300 uses a p+/n− photodiode 308 in lieu of n+/p− photodiode 112, where the p+ region is connected to the p+ drain of reset transistor 306, and the n− region is connected to the third line GL. Imaging cell 300 further differs from cell 200 in that imaging cell 300 utilizes a p-channel EEPROM structure 310 in lieu of n-channel EEPROM structure 210.

EEPROM structure 310, which can be formed as either a single poly structure or a double poly structure using conventional processes, has a conductive control gate 312 that electrically contacts the p+ region of photodiode 308, a first layer of dielectric 314 (such as oxide-nitride-oxide (ONO)) that contacts control gate 312, a conductive floating gate 316 that contacts dielectric layer 314, and a second layer of dielectric 318 that contacts floating gate 316.

In addition, EEPROM structure 310 is formed to have a coupling ratio so that the potential on floating gate 316 is approximately 90% of the voltage on the p+ region of photodiode 306. (First dielectric layer 314 can be formed to be approximately 0.1 to 10× larger in area than second dielectric layer 318.)

EEPROM structure 310 also includes a channel region 320 of a n− material that lies below floating gate 316, a p+ source region 322 that is formed in the n− material to contact channel region 320, and a spaced-apart, p+ drain region 324 that is formed in the n− material to contact channel region 320. In addition, drain region 324 is electrically connected to the drain of select transistor 118. (EEPROM structure 310 is one example of a non-volatile memory cell. Other NVM structures, such as more complex flash memory structures, can alternately be used.)

In operation, imaging cell 300 begins an image capture cycle by placing a third read voltage, e.g., ground, on first line RL, and a fourth read voltage on second line CL which, in turn, places the fourth read voltage on source region 322 of EEPROM structure 310. In addition, a reverse-bias voltage is placed on third line GL, while a fifth read voltage is placed on drain region 324 of EEPROM structure 310 via select transistor 118.

Following this, imaging cell 300 pulses on reset transistor 306 which places the third read voltage (less the threshold voltage of reset transistor 306) on both the p+ region of photodiode 308 and the control gate 312 of EEPROM structure 310. The third read voltage is less than the reverse-bias voltage which insures that p+/n− photodiode 308 remains reverse biased.

When the third read voltage is placed on control gate 312, EEPROM structure 310 sources a pre-image cycle current that has a magnitude which is a function of the total charge on floating gate 316. The magnitude of the pre-image cycle current is then sensed by conventional current detectors.

Following this, imaging cell 300 places a negative fifth programming voltage, e.g., −6V, on first line RL, and a sixth programming voltage, e.g., ground on second line CL which, in turn, places the sixth programming voltage on the source of EEPROM structure 310. A negative seventh programming voltage, e.g., −4.6V, is also placed on the drain of EEPROM structure 310 via select transistor 118.

Following this, imaging cell 300 pulses on reset transistor 306 which places the negative fifth programming voltage (less the threshold voltage of reset transistor 306) on both the p+ region of photodiode 308 and the control gate 312 of EEPROM structure 310. When the negative fifth programming voltage is placed on control gate 312, EEPROM structure 310 begins injecting electrons onto floating gate 316 via hot electron injection, thereby programming EEPROM structure 310. (Although the vertical electric field opposes the injection of hot electrons, this is a relatively minor effect.)

At the same time, photodiode 308 pulls up the magnitude of the negative fifth programming voltage that was placed on both the p+ region of photodiode 308 and control gate 312. The magnitude of the negative fifth programming voltage is pulled up over a first integration period (which begins when the negative fifth programming voltage is placed on the p+ region) as the light energy collected by photodiode 308 is converted into holes that increase the voltage on the p+ region of photodiode 308. As the voltage on the p+ region of photodiode 308 increases, the voltage on control gate 312 increases.

As the voltage on control gate 312 is increased, the number of electrons that are injected onto floating gate 316 is reduced. Thus, dim light or no light conditions increase the magnitude of the negative fifth programming voltage only slightly which, in turn, means that the number of electrons that are injected (as EEPROM structure 310 is programmed) decreases only slightly, if at all, over the integration period. However, a bright light source substantially increases the magnitude of the negative fifth programming voltage which, in turn, means that the number of electrons that are injected (as EEPROM structure 310 is programmed) substantially decreases over the integration period.

Eventually, if the magnitude of the negative fifth programming voltage on control gate 312 is raised high enough, electron injection, and thereby the programming of EEPROM structure 310, substantially stops. As a result, the total charge held by EEPROM structure 310 at the end of the first integration period represents the light energy collected during the first integration period.

At the end of the first integration period, imaging cell 300 again pulses on reset transistor 306 which, in turn, again places the negative fifth programming voltage (less the threshold voltage of reset transistor 306) on both the p+ region of photodiode 308 and the control gate 312 of EEPROM structure 310.

When the negative fifth programming voltage is placed on both the p+ region of photodiode 308 and the control gate 312 of EEPROM structure 310, EEPROM structure 310 again begins injecting electrons onto floating gate 316 via hot electron injection, thereby further programming EEPROM structure 310.

Photodiode 308 again pulls up the magnitude of the negative fifth programming voltage placed on the p+ region of photodiode 308 and control gate 312. The magnitude of the negative fifth programming voltage is pulled up over a second integration period, which begins when the negative fifth programming voltage is placed on control gate 312 for the second time, as the light energy collected by photodiode 308 is converted into holes that increase the voltage on the p+ region which, in turn, increase the voltage on control gate 312. As a result, the total charge held by EEPROM structure 310 at the end of the second integration period represents the sum of the light energy collected during the first and second integration periods.

Imaging cell 300 then repeats the above steps for a third integration period, and continues until n sequential integration periods have been completed. As a result, at the end of the n sequential integration periods, the total charge held by EEPROM structure 310 represents the sum of the light energy collected during the n sequential integration periods.

Once the last integration period has been completed, the total charge stored on EEPROM structure 310 is then read. To read a charge, imaging cell 300 places the third read voltage on first line RL, and the fourth read voltage on second line CL which, in turn, places the fourth read voltage on the drain of EEPROM structure 310. Ground is also placed on the drain of EEPROM structure 310. The third read voltage is greater than the fifth programming voltage.

Following this, imaging cell 300 pulses on reset transistor 306 which places the third read voltage (less the threshold voltage of reset transistor 306) on both the p+ region of photodiode 308 and the control gate 312 of EEPROM structure 310. When the third read voltage is placed on control gate 312, EEPROM structure 310 sources a post image cycle current, which has a magnitude that is a function of the total charge on floating gate 316. The magnitude of the post image cycle current is then sensed using conventional current detectors.

Following this, the number of photons that were absorbed over the image capture cycle by photodiode 308 is determined by subtracting the post image cycle current read out at the end of the last integration period from the pre-image cycle current level read out at the beginning of the first integration period.

Imaging cell 300 is erased prior to the next image capture cycle via exposure to UV light, or Fowler-Nordheim tunneling. With Fowler-Nordheim tunneling, voltages are placed on control gate 312 (via reset transistor 306), the n− material of channel 320, source region 322 and drain region 324 that is sufficient to cause electrons which are stored on floating gate 316 to tunnel through to control gate 312, the n− material of channel 320, source region 322, or drain region 324, depending on where the tunneling is to take place.

EEPROM structure 310 need not be read at the beginning of each image capture cycle if the charge on floating gate 316 of EEPROM structure 310 can be set to a substantially constant level each time structure 310 is erased. (In addition, the pre-image cycle current level can alternately be read out each time the post image cycle current is read out, but after the post image cycle current level has been read out, and a charge has again been set on floating gate 316 after EEPROM structure 310 has been erased.)

In addition to hot electron injection, EEPROM structure 310 can also be programmed using the GIDL current as described above and in the '185 application. When programming with the GIDL current, imaging cell 300 places a positive eighth programming voltage, e.g., +2V, on the first line RL (which is less than the reverse-bias voltage), and a ninth programming voltage on second line CL which, in turn, places the ninth programming voltage on the source of EEPROM structure 310. In addition, a negative tenth programming voltage, e.g., −4.6V, is also placed on the drain of EEPROM structure 310 via select transistor 118.

Following this, imaging cell 300 pulses on reset transistor 306 which places the positive eighth programming voltage (less the threshold voltage of reset transistor 306) on both the p+ region of photodiode 308 and the control gate 312 of EEPROM structure 310. The positive eighth programming voltage is less than the reverse biased voltage to insure that the p+/n− junction remains reverse biased. When the positive eighth programming voltage is placed on control gate 312 of EEPROM structure 310, no electron injection occurs.

At the same time, photodiode 308 begins pulling up the magnitude of the eighth programming voltage that was placed on both the p+ region of photodiode 308 and control gate 312. The magnitude of the eighth programming voltage is pulled up over a first integration period (which begins when the eighth programming voltage is placed on the p+ region) as the light energy collected by photodiode 308 is converted into holes that increase the voltage on the p+ region of photodiode 308.

As the voltage on the p+ region of photodiode 308 increases, the strength of the electric field increases to the point where electrons begin to be injected onto floating gate 316 due to the GIDL effect in the same manner as described with respect to imaging cell 200. Thus, as the voltage on control gate 312 rises, the number of electrons that are injected onto floating gate 316 increases. Thus, dim light or no light conditions increase the magnitude of the eighth programming voltage only slightly which, in turn, means that few electrons are injected, if any, over the integration period.

However, a bright light source substantially increases the magnitude of the eighth programming voltage which, in turn, means that the number of electrons that are injected (as EEPROM structure 310 is programmed) substantially increases over the integration period. As a result, the total charge held by EEPROM structure 310 at the end of the first integration period represents the light energy collected during the first integration period.

At the end of the first integration period, imaging cell 300 pulses on reset transistor 306 which, in turn, again places the positive eighth programming voltage (less the threshold voltage of reset transistor 306) on both the p+ region of photodiode 308 and the control gate 312 of EEPROM structure 310.

When the positive eighth programming voltage is again placed on both the p+ region of photodiode 308 and the control gate 312 of EEPROM structure 310, EEPROM structure 310 again begins injecting electrons onto floating gate 316 via the GIDL effect as the voltage on the p+ region of photodiode 308 increases over a second integration period. As a result, the total charge held by EEPROM structure 310 at the end of the second integration period represents the sum of the light energy collected during the first and second integration periods.

Imaging cell 300 then repeats the above steps for a third integration period, and continues until n sequential integration periods have been completed. As a result, at the end of the n sequential integration periods, the total charge held by EEPROM structure 310 represents the sum of the light energy collected during the n sequential integration periods.

Thus, even if only a few electrons are injected onto floating gate 316 during a single integration period, when integrated over a large number of times, the total charge present on floating gate 316 can be substantially increased. As above, once the last integration period has been completed, the total charge stored on EEPROM structure 310 is then read to determine the post image capture current.

In addition to hot electron and GIDL-effect programming, EEPROM structure 310 can also be programmed as described in U.S. patent application Ser. No. 10/664,469 for "Method of PMOS Stacked-Gate Memory Cell Programming Enhancement Utilizing Stair-Like Pulses of Control Gate Voltage" filed on Sep. 17, 2003, and U.S. patent application Ser. No. 10/664,758 for "An Efficient Method of PMOS Stacked-Gate Memory Cell Programming Utilizing Feedback Control of Substrate Current" (P05682) filed on Sep. 17, 2003, which are hereby incorporated by reference.

In a first embodiment of imaging cells 200 and 300, EEPROM structures 210 and 310 are structurally similar to prior-art EEPROM devices, such as flash devices, in that EEPROM structures 210 and 310 and the prior-art devices both have a conductive control gate, a first layer of dielectric that contacts the control gate, a conductive floating gate that contacts the first dielectric layer, and a second layer of dielectric that contacts the floating gate. In the first embodiment, the programming voltages, the read voltages, and the erase voltages are roughly equivalent to prior-art programming, reading, and erasing voltages.

However, in a second embodiment, EEPROM structures 210 and 310 differ from prior-art EEPROM devices in that the thicknesses of the first and second dielectric layers 214 and 218 in EEPROM structure 210 and the first and second dielectric layers 314 and 318 in EEPROM structure 310 are substantially thinner than the thicknesses of the first and second dielectric layers in a prior-art EEPROM device.

With the relatively thicker dielectric layers used in prior-art, n-channel, EEPROM devices, relatively large programming voltages needs to be applied to the control gate and the drain while ground is applied to the source to initiate hot-electron injection which, in turn, programs the memory. On the other hand, when the thicknesses of the dielectric layers are substantially reduced, the programming voltage applied to the control gate required to initiate hot electron injection is also substantially reduced (assuming the drain and source voltages remain the same). As a result, when relatively thin dielectric layers are used, relatively low programming voltages can be applied to the control gate to initiate hot-electron injection in an n-channel device. Similar results apply to p-channel, EEPROM devices.

Prior-art EEPROM devices are unable to use thinner layers of dielectric because conventional. EEPROM devices have substantial data retention and data read requirements. In other words, conventional EEPROM devices must be able to store charge states for years, and must be able to be read thousands of times. In the second embodiment of the present invention, however, EEPROM structures 210 and 310 need only hold a charge for a few seconds, and be read once (or at most a few times).

Thus, the difference between the first and second embodiments of EEPROM structures 210 and 310 is that, following an image capture cycle, EEPROM structures 210 and 310 can hold the stored charge for a long period of time in the first embodiment. In the second embodiment, however, the charge held by EEPROM structures 210 and 310 must be processed immediately.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor circuit comprising:
   a reset transistor having a drain region, a source region, and a gate connected to receive a plurality of reset pulses;
   a photodiode connected to the reset transistor; and
   a non-volatile memory device connected to the reset transistor and the photodiode; wherein the non-volatile memory device has a drain region, a source region, a floating gate, and a control gate that is connected to the reset transistor and the photodiode, wherein the plurality of reset pulses occur during a single image capture cycle and wherein when a first number of photons are collected by the photodiode, a first number of electrons are injected onto the floating gate, and when a second number of photons less than the first number are collected by the photodiode, a second number of electrons are injected onto the floating gate that is greater than the first number.

2. The semiconductor circuit of claim 1 wherein the drain and source regions of the non-volatile memory device have a p conductivity type.

3. The semiconductor circuit of claim 1 wherein the drain and source regions of the non-volatile memory device have an n conductivity type.

4. A semiconductor circuit comprising:
   a reset transistor having a drain region a source region, and a gate connected to receive a plurality of reset pulses;
   a photodiode connected to the reset transistor; and
   a non-volatile memory device connected to the reset transistor and the photodiode; wherein the non-volatile memory device has a drain region, a source region, a floating gate, and a control gate that is connected to the reset transistor and the photodiode, wherein the plurality of reset pulses occur during a single image capture cycle and wherein when a first number of photons are collected by the photodiode, a first number of electrons are injected onto the floating gate, and when a second number of photons less than the first number are collected by the photodiode, a second number of electrons are injected onto the floating gate that is less than the first number.

5. A semiconductor circuit comprising:
   a reset transistor having a drain region, a source region, and a gate connected to receive a plurality of reset pulses;
   a photodiode connected to the reset transistor; and
   a non-volatile memory device connected to the reset transistor and the photodiode; wherein the non-volatile memory device has a drain region, a source region, a floating gate, and a control gate that is connected to the reset transistor and the photodiode, wherein the plurality of reset pulses occur during a single image capture cycle and wherein when a first number of photons are collected by the photodiode, a first number of electrons are injected onto the floating gate, and when a second number of photons less than the first number are collected by the photodiode, a second number of electrons are injected onto the floating gate that is less than the first number and wherein the drain and source regions of the non-volatile memory device have a p conductivity type.

6. A semiconductor circuit comprising:
   a reset transistor having a drain region, a source region, and a gate connected to receive a plurality of reset pulses;
   a photodiode connected to the reset transistor; and
   a non-volatile memory device connected to the reset transistor and the photodiode; wherein the non-volatile memory device has a drain region, a source region, a floating gate, and a control gate that is connected to the reset transistor and the photodiode, wherein the plurality of reset pulses occur during a single image capture cycle and wherein when a first number of photons are collected by the photodiode a first number of electrons are injected onto the floating gate and when a second number of photons less than the first number are collected by the photodiode, a second number of electrons are injected onto the floating gate that is less than the first number and wherein the drain and source regions of the non-volatile memory device have an n conductivity type.

7. A method of capturing an image with an imaging cell, the imaging cell comprising:
   a reset transistor having a drain region, a source region, and a gate connected to receive a plurality of reset pulses; and
   a photodiode connected to the reset transistor,
   the method comprising the steps of:
   placing a reset voltage on the photodiode by pulsing on the reset transistor; and
   collecting photons for a second period of time, the collected photons changing a magnitude of the reset voltage over the second period of time.

8. The method of claim 7 and further comprising the step of storing a charge that represents a number of photo-generated charge carriers that were collected during the second period of time.

9. The method of claim 8 and further comprising the step of repeating the placing, collecting, and storing steps a plurality of times to generate a total stored charge.

10. The method of claim 9 wherein the total stored charge represents a single bit of an image.

11. The method of claim 9 and further comprising the step of reading the total stored charge to generate a post image cycle current.

12. The method of claim 11 and further comprising the step of generating a pre-image cycle current prior to collecting photons for the second period of time.

13. The method of claim 12 and further comprising the step of subtracting the post image cycle current from the pre-image cycle current.

\* \* \* \* \*